(12) United States Patent
Hwang et al.

(10) Patent No.: US 6,211,048 B1
(45) Date of Patent: Apr. 3, 2001

(54) METHOD OF REDUCING SALICIDE LATERAL GROWTH

(75) Inventors: Tsing-Fong Hwang; Tsung-Yuan Hung, both of Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/241,792

(22) Filed: Feb. 1, 1999

(30) Foreign Application Priority Data

Dec. 21, 1998 (TW) .................................................. 87121315

(51) Int. Cl.[7] .................. H01L 21/3205; H01L 21/4763
(52) U.S. Cl. .......................... 438/592; 438/595; 438/300; 438/301; 438/303; 438/305; 438/655; 438/660; 438/663; 438/664; 438/657
(58) Field of Search ..................... 438/595, 655, 438/660, 663, 664, 651, 300, 303, 305

(56) References Cited

U.S. PATENT DOCUMENTS

| 5,149,750 | * | 9/1992 | Moslehi . |
|---|---|---|---|
| 5,168,072 | * | 12/1992 | Moslehi . |
| 5,314,832 | * | 5/1994 | Deleonibus . |
| 5,447,875 | * | 9/1995 | Moslehi . |
| 5,686,331 | * | 11/1997 | Song . |
| 5,714,398 | * | 2/1998 | Chao et al. . |
| 5,902,125 | * | 5/1999 | Wu . |
| 5,953,605 | * | 9/1999 | Kodama . |
| 5,953,614 | * | 9/1999 | Liu et al. . |
| 6,013,596 | * | 1/2000 | Lur et al. . |
| 6,069,044 | * | 5/2000 | Wu . |

* cited by examiner

Primary Examiner—John F. Niebling
Assistant Examiner—Jonathan Hack
(74) Attorney, Agent, or Firm—Jiawei Huang; J C Patents

(57) ABSTRACT

A method for reducing salicide lateral growth. A substrate having a gate structure and an anti-reflection layer on the gate structure is provided. A spacer is formed on the side wall of the gate structure and the anti-reflection layer. Then, the anti-reflection layer is removed to expose the gate structure; wherein the gate structure and the spacers together form a recess structure. A salicide layer is formed on the gate structure in the recess structure and on the substrate.

20 Claims, 4 Drawing Sheets

METHOD OF REDUCING SALICIDE LATERAL GROWTH

CROSS-REFERENCE TO RELATED APPLICATION

This application claims the priority benefit of Taiwan application ser. no. 87121315, filed Dec. 21, 1998, the full disclosure of which is incorporated herein by reference.

BACKGROUND OF THE INVENTION

1. Field of the Invention

The present invention relates to a method of manufacturing a semiconductor device. Particularly, the present invention relates to a method of manufacturing a salicide layer and more particularly, to a method of manufacturing a salicide layer on a gate structure.

2. Description of the Related Art

Usually, silicide is formed On the gates, the source/drain region or the interconnects to lower the contact resistance between the semiconductor devices on a substrate. Since lattice of the silicide is rearranged when it is treated by high-temperature annealing, the defects in the silicide are eliminated, wherein the defects are eliminated, and perfect grains are grown instead of defective grains. A crystalline structure is formed in the silicide after a high-temperature annealing is performed so that the resistance of the silicide is lowered. Hence, the contact resistance can be reduced by forming a silicide layer on the gates, the source/drain region or the interconnects. Currently, the process of self-aligned silicide (salicide) is widely used in the integrated circuits industry.

FIGS. 1A through 1B are schematic, cross-sectional views of the conventional process for manufacturing a salicide layer on a semiconductor substrate.

As shown in FIG. 1A, a substrate 100 having agate structure 102 is provided. A light implantation step is used to form a lightly doped source/drain region 110 adjacent to the gate structure 102 in the substrate 100. A spacer 104 is formed on the sidewall of the gate structure 102. The gate structure 102 comprises a gate oxide layer 106 and a gate electrode 108.

As shown in FIG. 1B, a heavy implantation step is used to form a source/drain region 112 in the substrate 100 exposed by the gate structure 102 and the spacer 104. A titanium layer (not shown) is formed over the substrate 100. A thermal process is performed to convert portions of the titanium layer above the gate electrode 108 and the source/drain region 112 into a silicide layer 114, which is a titanium nitride layer. The remaining titanium layer, which is not converted into the silicide layer, is stripped away to finish the process of manufacturing a salicide layer.

Since portions of silicon in or on the gate electrode 108 and the source/drain region 112 diffuse to the spacer 104 to spread onto the surface of the spacer 104 as temperature rises, a silicide layer 116 is formed on the spacer 104, when the silicide layer 114 is formed on the gate electrode 108 and the source/drain region 112. In such a circumstance, when the silicide layer 116 connects the gate electrode 108 and the source/drain region 112, it results in a bridging effect. Hence, an undesired electrical coupling occurs between semiconductor devices, and the yield is low.

In order to prevent bridging effects from occurring between the devices, the thermal process is performed at a relatively low temperature of about 700–750° C. to reduce the diffusion of the silicon from the gate electrode 108 and the source/drain region 112 into the spacer 104, especially from the surface portion of the gate electrode, which results in the lateral formation of salicide. However, the relatively low temperature of the thermal process produces a salicide with a relatively poor quality, so the goal of reducing the contact resistance cannot be achieved.

Therefore, there is a need to provide a method for reducing salicide lateral growth, which maintains the desired performance between semiconductor devices and avoids the bridging effect therebetween.

SUMMARY OF THE INVENTION

The invention provides a method of reducing salicide lateral growth. In accordance with the present invention, the bridging effect caused by the lateral salicide formation will be minimized and the quality of the salicide layer will be improved as well.

To achieve these and other advantages and in accordance with the purpose of the invention, as embodied and broadly described herein, the invention provides a method of reducing salicide lateral growth. A substrate having a gate structure and an anti-reflection layer on the gate structure is provided. A spacer is formed on the sidewall of the gate structure and the anti-reflection layer. The anti-reflection layer is removed to expose the gate structure, wherein the gate structure and the spacers together form a recess structure. A salicide layer is formed on the gate structure in the recess structure and on the substrate. Since the recess structure is formed by a combination of the gate electrode and the spacers, the diffusion of the silicon from the top surface portion of the gate electrode to the surface of the spacer can be avoided while the thermal process is performed at a relatively high temperature. Therefore, the bridging effect caused by the lateral salicide formation cannot occur. Additionally, the weakness of the poor quality of the salicide formed by the thermal process with a relatively low temperature to prevent the devices from the bridging effect can be removed. Furthermore, because of the thick salicide layer formed on the gate electrode in the recess structure, the quality of the salicide is enhanced and the contact resistance is extremely reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
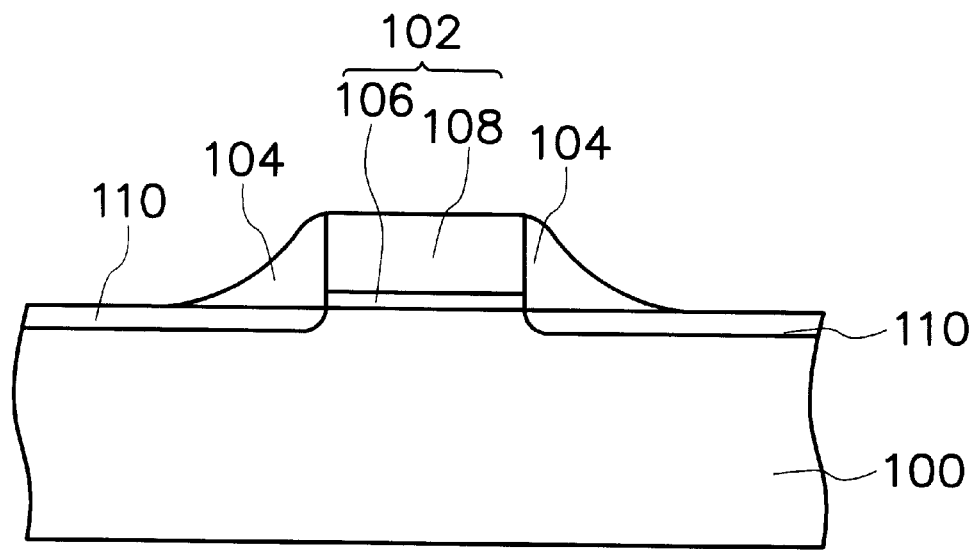
FIGS. 1A through 1B are schematic, dross-sectional views of the conventional process for manufacturing a salicide layer.
Figure 1B:
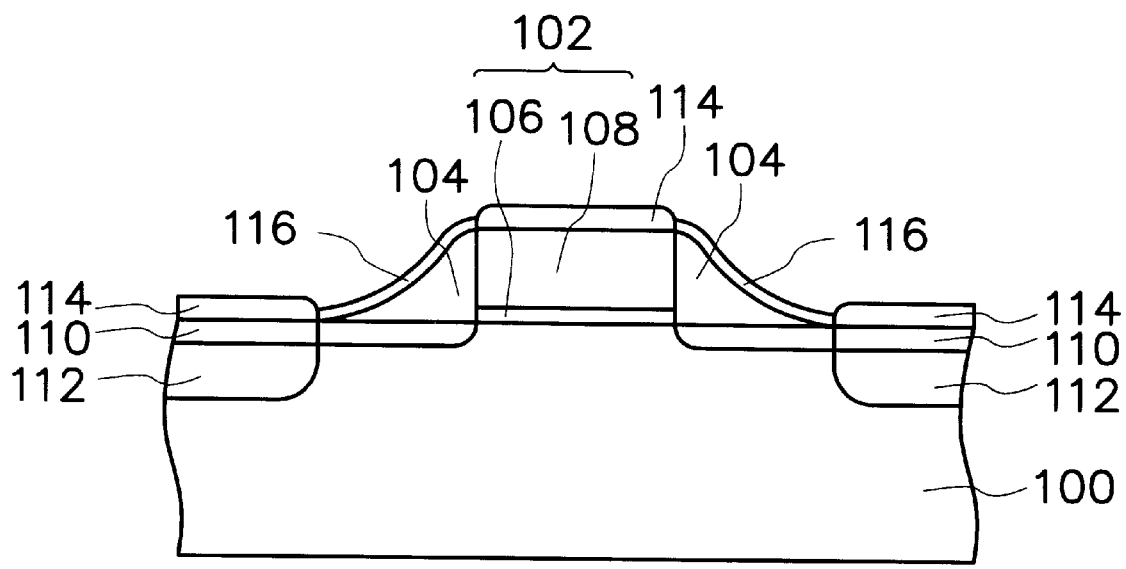

Reference will now be made in detail to the present preferred embodiments of the invention, examples of which are illustrated in the accompanying drawings. Wherever possible, the same reference numbers are used in the drawings and the description to refer to the same or like parts.

Figure 2A:
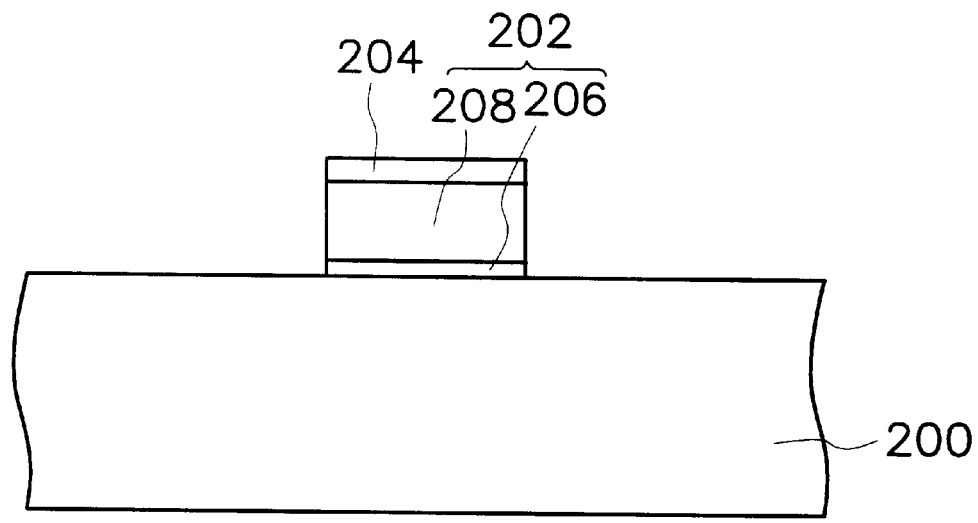
FIGS. 2A through 2F are schematic, cross-sectional views of the process for manufacturing a salicide layer in a preferred embodiment according to the invention.

FIGS. 2A through 2F are schematic, cross-sectional views of the process for manufacturing a salicide layer in a preferred embodiment according to the present As shown in FIG. 2A, a substrate 200 having a gate structure 202 that is covered by an anti-reflection layer 204 is provided. The gate structure 202 comprises a gate oxide layer 206 and a gate electrode 208. The gate electrode 208 is made of polysilicon, for example. The anti-reflection layer 204 is used to avoid the interference produced by a reflection effect while the photolithography is performed to form the gate structure 202. The anti-reflection layer 204 is made of silicon-oxy-nitride, for example. The thickness of the anti-reflection layer 204 is preferably about 250–300 angstroms.

Figure 2B:
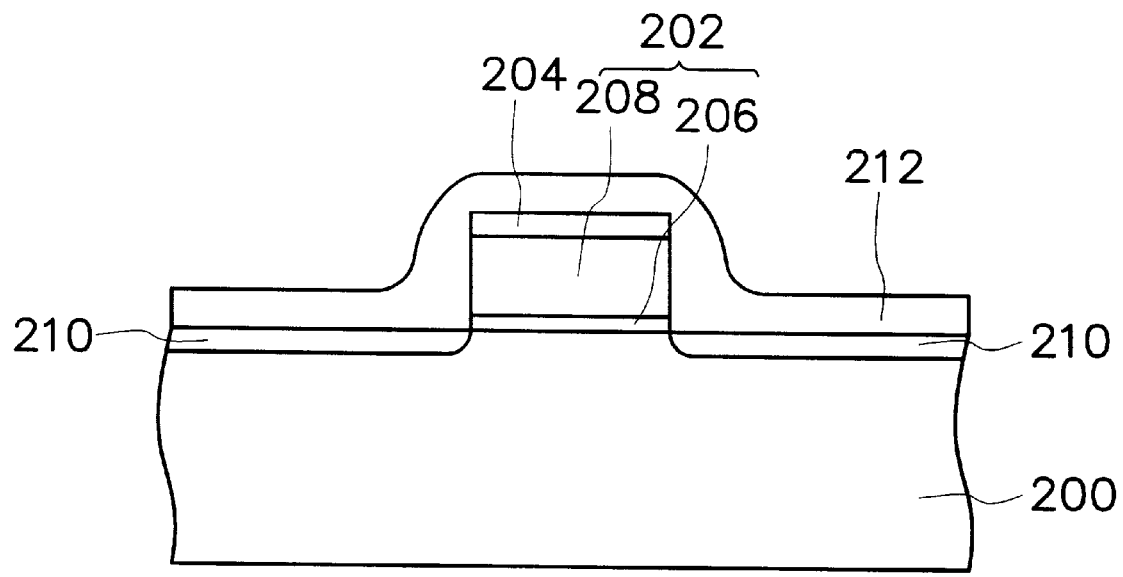

As shown in FIG. 2B, a light implantation step is performed to form a lightly doped source/drain region 210 adjacent to the gate structure 202 in the substrate 200. An insulating layer 212 is formed on the anti-reflection layer 204 and the substrate 200. The formation of the insulating layer 212 is preformed by the conventional method known to the skilled in the art. Preferably, in this example, the method of forming the insulating layer 212 is low-pressure chemical vapor deposition (LPCVD) with a tetraethylorthosilicate (TEOS) gas source.

Figure 2C:
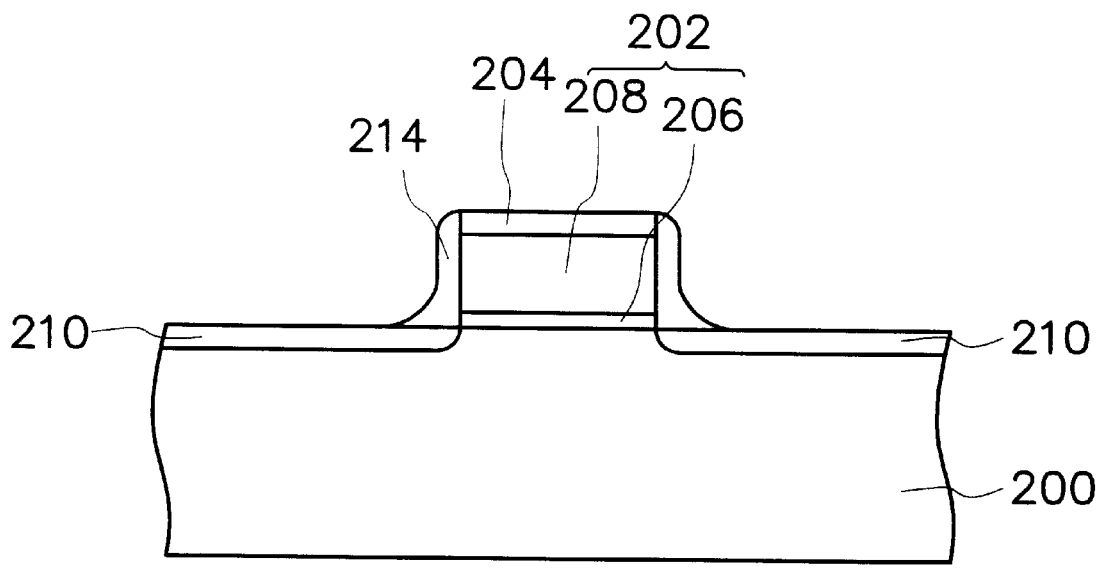

As shown in FIG. 2C, a spacer 214 is formed on the sidewall of the gate structure 202 and the anti-reflection layer 204 by removing portions of the insulating layer 212. The top of the spacer 214 is higher than that of the gate structure 202. The method of removing the portions of the insulating layer 212 is conducted by a conventional method known to the skilled in the art. In this example, the removal of portion of the insulating layer 212 is anisotropic etching. The spacer preferably is made of silicon oxide.

Figure 2D:
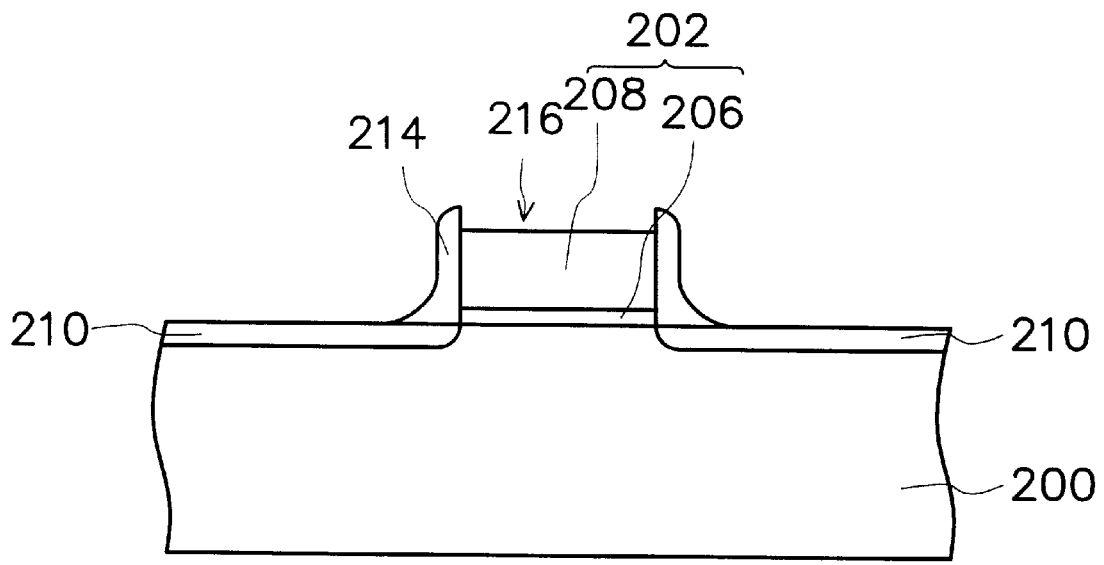
Figure 2E:
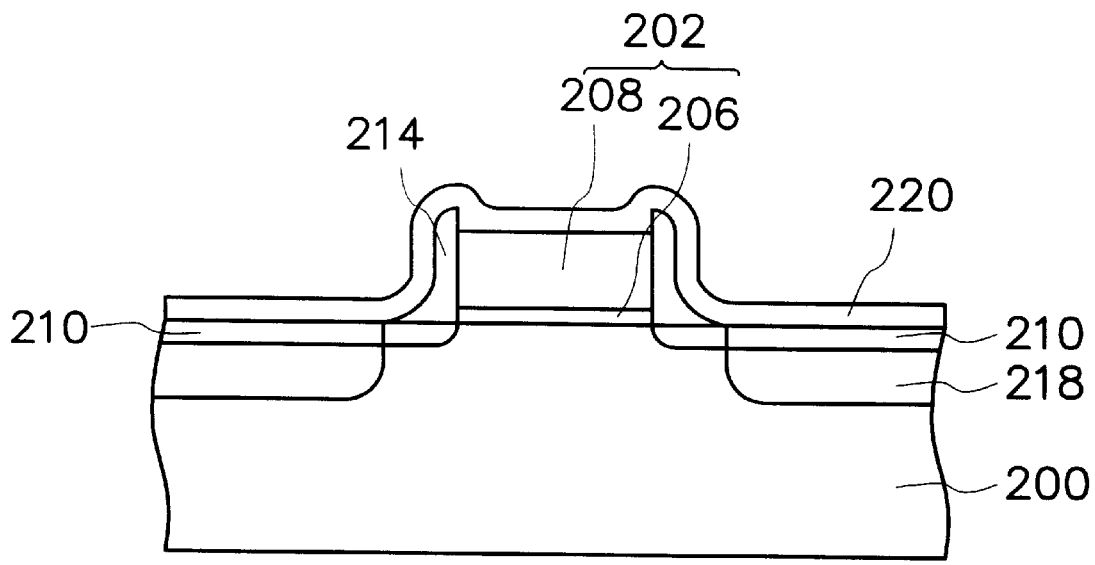
Figure 2F:
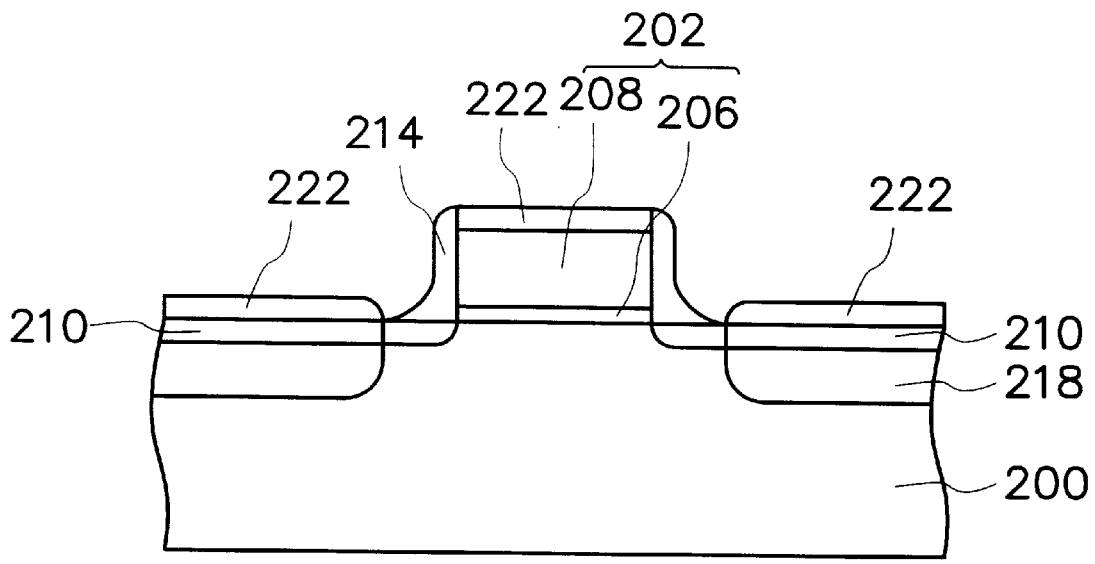

As shown in FIG. 2D, the anti-reflection layer 204 is removed to expose the surface of the gate electrode 208. Since the top of the spacer 214 is higher than that of the gate structure 202, a recess structure 216 is formed by a composition of the gate electrode 208 and the spacers 214. The depth of the recess structure 216 preferably is about 250–350 angstroms. In the subsequent thermal process, a relatively thick salicide 222 (as shown in FIG. 2F) is formed in the recess structure 216. Additionally, the recess structure can prevent the diffusion of the silicon from the top surface portion of the gate electrode 208 to the surface of the spacer 214. As shown in FIG. 2E, a heavy implantation step is used to form a source/drain region 218 adjacent to the spacer 214 in the substrate 200. A metal layer is formed on the gate structure 202, the spacer 214 and the substrate 200. The metal layer 220 is made of refractory metal, for example. The refractory metal includes titanium, tungsten, cobalt, nickel, platinum and palladium, for example. The method of forming the metal layer 220 can be performed by a conventional method known to the skilled in the art. In this example, the metal layer is formed by sputtering.

As shown in FIG. 2F, a thermal process is used to convert portions of the metal layer 220 above the gate electrode 208 and the source/drain region 218 into a salicide layer 222. The salicide layer can be a titanium nitride layer, for example. The remaining metal layer 220, which is not converted into the salicide layer 222, is removed to expose the salicide layer 222 and the source/drain region 218. The method of removing the metal layer 220 can be performed by a conventional method known to the skilled in the art. In this example, the removal of the metal layer is by wet etching. Since the top of the spacer is higher than that of the gate structure, the diffusion of the silicon from the top surface portion of the gate electrode to the surface of the spacer can be avoided while the thermal process is performed at a relatively high temperature. Accordingly, the bridging effect caused by the lateral salicide formation cannot occur. Additionally, by using the method according to the invention, the salicide layer formed by the thermal process with a relatively high temperature possesses relatively high quality. Therefore, the weakness of the poor quality of the salicide formed by the thermal process with a relatively low temperature to prevent the devices from the bridging effect can be removed. Furthermore, because of the thick salicide layer formed on the gate electrode in the recess structure, the quality of the salicide is enhanced and the contact resistance is extremely reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a salicide layer on a semiconductor substrate, comprising the steps of:

providing a substrate having a gate structure and an anti-reflection layer on the gate structure;

forming a spacer directly on sidewalls of the gate structure and the anti-reflection layer, wherein the spacer also has direct contact with the substrate;

removing the anti-reflection layer to expose the gate structure, wherein the gate structure and spacers together form a recess structure; and forming a salicide layer on the gate structure in the recess structure and on the substrate.

2. The method of claim 1, further comprising the step of forming a source/drain region adjacent to the spacer in the substrate by a heavy implantation step after the step of removing the anti-reflection layer.

3. The method of claim 2, further comprising the step of forming a lightly doped source/drain region adjacent to the gate structure in the substrate by a light implantation step before the step of forming the spacer.

4. The method of claim 3, further comprising the steps of before the step of forming the salicide layer;

forming a metal layer on the substrate, the recess structure and the spacer;

performing a thermal process to convert portions of the metal layer into the salicide layer above the gate structure and the substrate; and removing the remaining metal layer.

5. The method of claim 4, wherein the thermal process is performed at a temperature of about 750–800° C.

6. The method of claim 1, wherein the step of forming the spacer further comprises the steps of:

forming an insulating layer to cover the substrate; and removing portions of the insulating layer to form a spacer on the sidewall of the gate structure and the anti-reflection layer.

7. The method of claim 6, wherein the step of removing the portions of the insulating layer is anisotropic etching.

8. The method of claim 1, wherein the gate structure comprises a gate electrode and a gate oxide layer.

9. The method of claim 1, wherein the anti-reflection layer is a silicon-oxynitride layer.

10. A method of manufacturing a semiconductor device on a substrate having a gate structure and an anti-reflection layer on the gate structure, the method comprising the steps of:

forming an insulating layer to cover the substrate;

removing portions of the insulating layer to form a spacer directly on sidewalls of the gate structure and the anti-reflection layer, wherein the spacer also has direct contact with the substrate; and removing the anti-reflection layer to expose the gate structure, wherein the gate structure and spacers together form a recess structure.

11. The method of claim 10, wherein the depth of the recess structure is about 250–300 angstroms.

12. A method of manufacturing a semiconductor device on a substrate having a gate structure and an anti-reflection layer on the gate structure, the method comprising the steps of:

forming an insulating layer to cover the substrate;

removing portions of the insulating layer to form a spacer direct on sidewalls of the gate structure and the anti-reflection layer, wherein the spacer also has direct contact with the substrate;

removing the anti-reflection layer to expose the gate structure, wherein the gate structure and spacers together form a recess structure;

forming a source/drain region adjacent to the spacer in the substrate;

forming a metal layer on the substrate, the recess structure and the spacer;

performing a thermal process to convert portions of the metal layer into the salicide layer above the gate structure and the substrate; and removing the remaining metal layer.

13. The method of claim 12, wherein the gate electrode is made of polysilicon.

14. The method of claim 12, wherein the spacer is made of silicon oxide.

15. The method of claim 12, further comprising the step of forming a lightly doped source/drain region adjacent to the gate structure in the substrate by a light implantation step before the step of forming insulating layer.

16. The method of claim 12, wherein the thermal process is performed at a temperature of about 750–800° C.

17. The method of claim 12, wherein the metal layer is made of refractory metal.

18. The method of claim 17, wherein the metal is selected from a group consisting of titanium, tungsten, cobalt, nickel, platinum and palladium.

19. The method of claim 12, wherein the depth of the recess structure is about 250–300 angstroms.

20. The method of claim 12, wherein the salicide layer is a titanium nitride.

* * * * *